United States Patent
Beat

(10) Patent No.: US 6,912,173 B2
(45) Date of Patent: Jun. 28, 2005

(54) METHOD AND SYSTEM FOR FAST MEMORY ACCESS

(75) Inventor: Robert Beat, Bristol (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/178,270

(22) Filed: Jun. 25, 2002

(65) Prior Publication Data

US 2003/0002376 A1 Jan. 2, 2003

Related U.S. Application Data

(60) Provisional application No. 60/301,458, filed on Jun. 29, 2001.

(51) Int. Cl.[7] .............................. G11C 8/00; G11C 7/00
(52) U.S. Cl. ........................... 365/230.03; 365/230.04; 365/230.06; 365/230.08; 365/233; 365/189.04
(58) Field of Search ....................... 365/230.03, 230.04, 365/230.06, 230.08, 189.04, 233, 189.05, 189.12

(56) References Cited

U.S. PATENT DOCUMENTS

| 3,440,615 | A | | 4/1969 | Carter | |
|---|---|---|---|---|---|
| 4,595,911 | A | * | 6/1986 | Kregness et al. | 341/78 |
| 4,961,162 | A | * | 10/1990 | Nguyenphu et al. | 708/510 |
| 5,553,263 | A | * | 9/1996 | Kalish et al. | 711/127 |
| 5,748,555 | A | * | 5/1998 | Park | 365/230.04 |
| 5,802,387 | A | * | 9/1998 | Boddie et al. | 712/42 |
| 6,065,070 | A | * | 5/2000 | Johnson | 710/22 |
| 6,076,136 | A | | 6/2000 | Burroughs et al. | |
| 6,115,805 | A | * | 9/2000 | Rhodes et al. | 712/204 |
| 6,138,214 | A | * | 10/2000 | Pfefferl | 711/137 |
| 6,148,386 | A | * | 11/2000 | Rhodes et al. | 711/200 |
| 6,205,536 | B1 | * | 3/2001 | Yoshida | 712/38 |
| 6,230,238 | B1 | * | 5/2001 | Langan et al. | 711/109 |
| 6,282,623 | B1 | * | 8/2001 | Halahmi et al. | 711/201 |
| 6,462,998 | B1 | * | 10/2002 | Proebsting | 365/205 |
| 6,754,780 | B1 | * | 6/2004 | Carlson et al. | 711/137 |
| 6,789,179 | B2 | * | 9/2004 | Beat | 711/201 |
| 2001/0016898 | A1 | * | 8/2001 | Ito et al. | 711/156 |
| 2002/0095426 | A1 | * | 7/2002 | Ishida et al. | 707/101 |
| 2003/0037190 | A1 | * | 2/2003 | Alexander et al. | 710/52 |

* cited by examiner

Primary Examiner—David Nelms
Assistant Examiner—Ly Duy Pham
(74) Attorney, Agent, or Firm—Sterne, Kessler, Goldstein & Fox P.L.L.C.

(57) ABSTRACT

An address device simultaneously provides a first address to a first memory section using a first address bus and a second, incrementally higher, address to a second memory section using a second address bus. A buffer can then read from or write to the first and second memory sections. During a read operation, the buffer can receive a first portion of a misaligned data word from the first memory section and read a second portion of the misaligned data word from the second memory section and assemble the data in the data word from the first and second portions. When the access operation is a write operation, the buffer can effectively perform a shift operation on the data in the data word, then write a first portion of the word to the first memory section and write a second portion of the word to the second memory section. Accordingly, data accesses that would take two memory-access cycles on a conventional memory system are reduced to a single memory-access cycle.

13 Claims, 7 Drawing Sheets

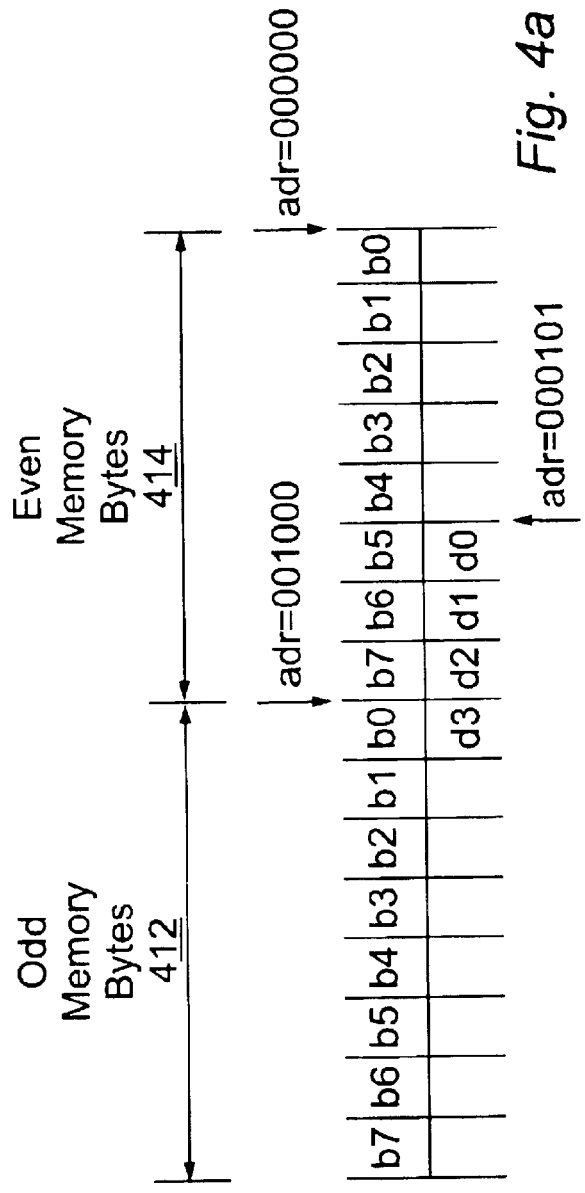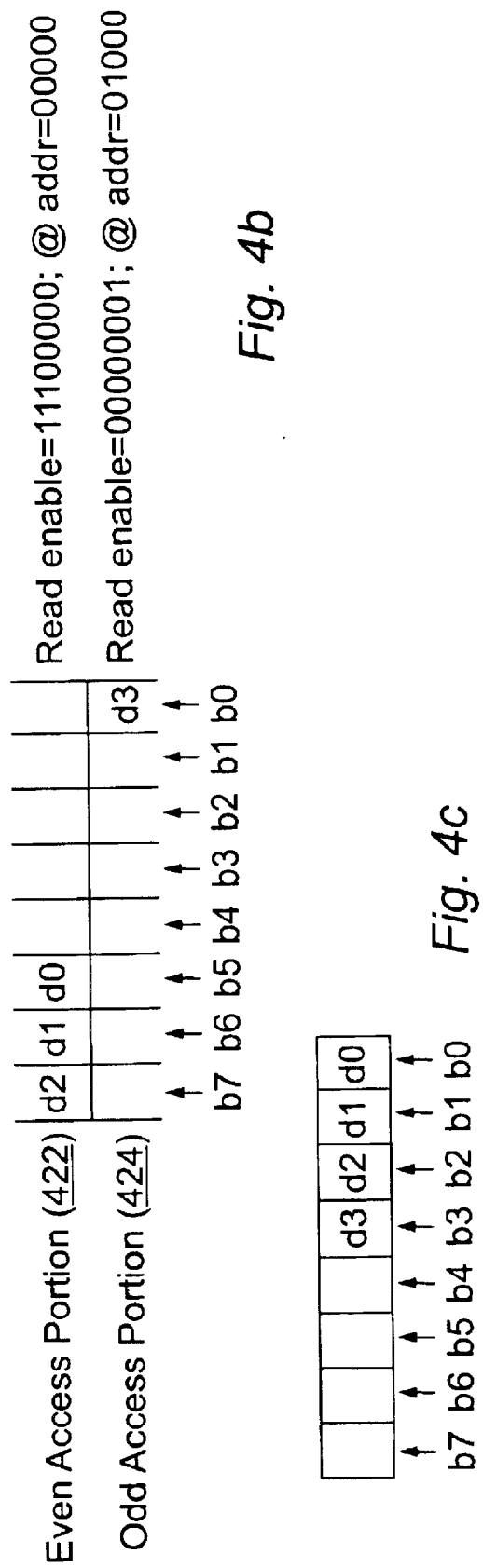
Fig. 4a
Fig. 4b
Fig. 4c

METHOD AND SYSTEM FOR FAST MEMORY ACCESS

CROSS-REFERENCE TO RELATED APPLICATION

This application claims priority to Provisional U.S. Patent Application No. 60/301,458, filed Jun. 29, 2001, which is incorporated herein by reference in its entirety.

BACKGROUND OF THE INVENTION

1. Field of the Invention

This invention relates to methods and systems for fast access of computer-based memories.

2. Related Art

Modern computer-based systems often use wide memories that have a constant width. However, these systems must often manipulate a variety of variables having different data widths. For instance, a particular processor can have a thirty-two bit (four byte) wide bus with a thirty-two bit wide random access memory (RAM), but must manipulate any number of variables having eight bit (one byte), sixteen bit (two bytes) or thirty-two bit widths.

One problem that can arise with such systems is that data can become misaligned with the physical boundaries of the available memory. For example, a first variable in a block of thirty-two bit wide RAM may be a byte-wide variable while a second variable may be a four-byte variable. As a result, the first variable will occupy the first byte of a first memory location, while the second variable will occupy the remaining three bytes of the first memory location plus the first byte of the next memory location. One unfortunate consequence of this situation is that a computer accessing the second variable can take two separate memory-access cycles to either read or write the second variable.

While various approaches are available to align various variables having different bit-widths with the address boundaries of a memory, these approaches typically require a wasteful use of available memory resources or otherwise cannot be used with practicable systems. Accordingly, new technologies that can eliminate multiple-cycle memory accesses for misaligned data are desirable.

SUMMARY OF THE INVENTION

The invention provides techniques to access a misaligned data word in a single memory-access cycle. In various embodiments, the techniques use a first memory section connected to a first address bus, a second memory section connected to a second address bus and an address device that simultaneously provides a first address to the first memory section using the first address bus and a second, incrementally higher, address to the second memory section using the second address bus. The first and second memory sections are preferably separate memory arrays.

When the access operation is a read operation, buffer circuitry can receive a first portion of the misaligned data word from the first memory section and receive a second portion of the misaligned data word from the second memory section and assemble the data in the data word from the first and second portions. When the access operation is a write operation, the buffer circuitry can effectively perform a shift operation on the data in the data word, then write a first portion of the shifted word to the first memory section and write a second portion of the shifted word to the second memory section.

Accordingly, data accesses that would take two memory-access cycles on a conventional memory system are reduced to a single memory-access cycle. Others features and advantages will become apparent in the following descriptions and accompanying figures.

BRIEF DESCRIPTION OF THE DRAWINGS

The invention is described in detail with regard to the following figures, wherein like numerals reference like elements, and wherein:

FIGS. 4A–4C depicts a second memory access operation according to the present invention;

DESCRIPTION OF RELATED ART

A frequent problem that arises with modern computer-based systems is that, while the widths of an available physical memory are fixed, the widths of various data types can vary. For example, a particular microcomputer may have a sixty-four bit wide memory, but may be required to access and manipulate eight-bit, sixteen-bit, thirty-two bit and sixty-four bit data. One problem that can arise with such systems is that different data variables can become misaligned with the address boundaries of the physical memories. For example, the first variable in a block of sixty-four bit wide memory may be a single byte-wide variable, while the second variable may be an eight byte-wide variable. As a result, the first variable will occupy a first byte of the first memory location, and the second variable will occupy the remaining seven bytes of the first memory location plus the first byte of the next memory location. One unfortunate consequence of this situation is that a processor accessing the second variable can require two separate memory-access cycles to either read or write the second variable.

However, by providing two separate physical memories each being sixty-four bits wide and further providing various circuitry that can make the two memories appear as a single memory where the addressed memory locations of the first memory are interleaved with those of the second memory location, misaligned data can be accessed in a single memory-access cycle. For the example above, the eight-byte misaligned data variable can be written in a single memory-access cycle by splitting the eight-byte variable into a first portion having the first seven bytes and a second portion having the last byte. Assuming that separate addresses and control signals are provided for each of the two physical memories, the first portion of the data variable can then be written to the last seven bytes of the first memory while the second portion can be simultaneously written to the first byte of the second memory. Similarly, data can be read by providing consecutive addresses to the first and second memories, selectively reading the desired bytes and then appropriately combining the selected bytes.

Figure 1:
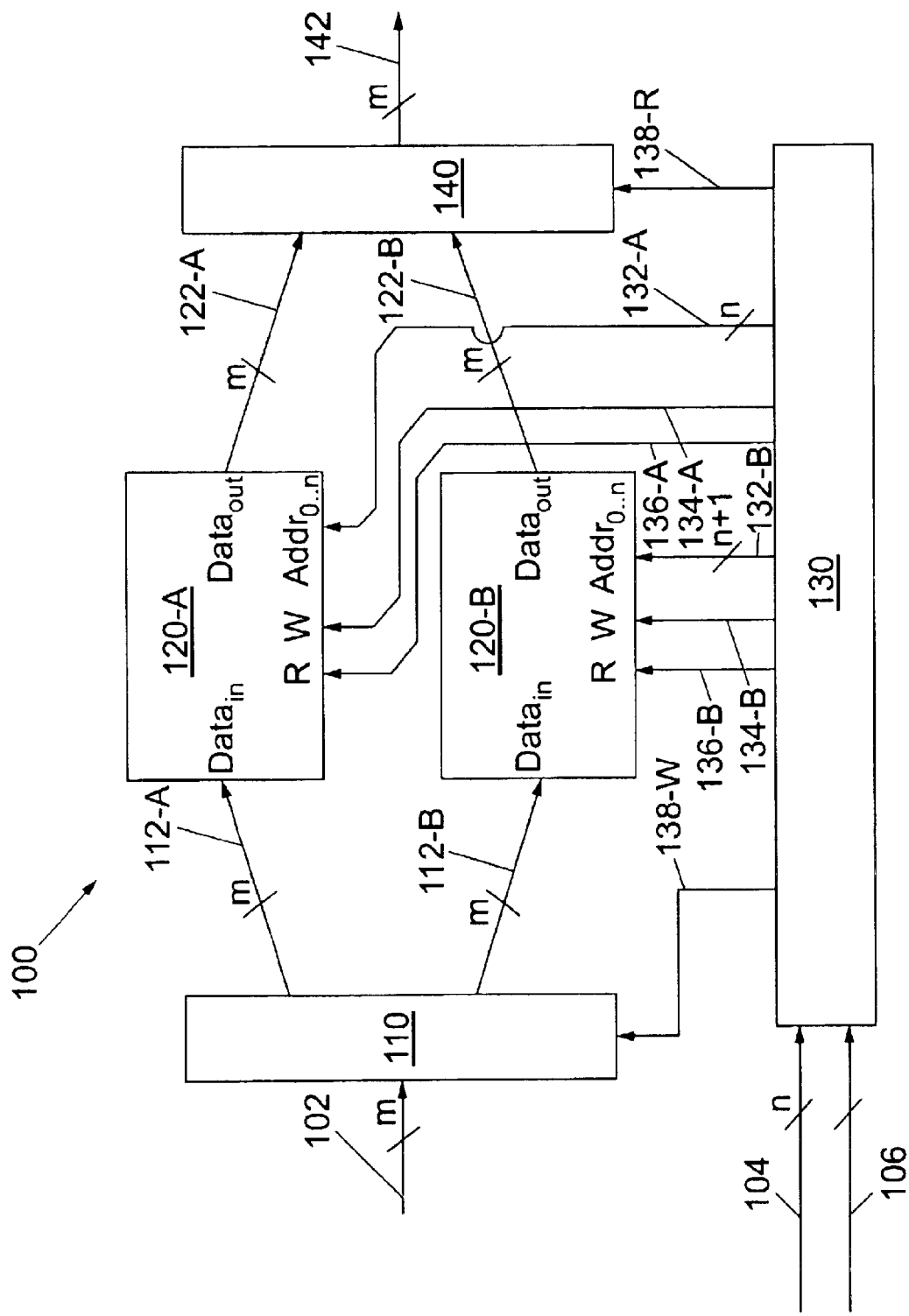
FIG. 1 is a block diagram of an exemplary system capable of accessing misaligned data in a single memory-access cycle according to the present invention.

FIG. 1 is a block diagram of a system 100 capable of accessing misaligned data in a single cycle according to the present invention. As shown in FIG. 1, the system 100 includes a first data buffer block 110, and address device 130, a second data buffer block 140, an even memory section 120-A and an odd memory section 120-B.

In a first operation, misaligned data can be written to the memory sections 120-A and 120-B in a single memory-access cycle. The exemplary memory sections 120-A and 120-B are each sixty-four bit wide (eight byte) devices each having 262,144 ($2^{18}$) separate locations. However, rather than appear as single memory having a width of 128 bits by 262,144 locations, the memory sections 120-A and 120-B can appear as a single physical memory having a width of sixty-four bits and 524,288 interleaved memory locations. For example, the first four memory locations of memory section 120-A can appear as addressed locations zero, two, four, six and eight, while the first four memory locations of memory section 120-B can appear as addressed locations one, three, five, seven and nine.

During operation, an external device (not shown) writing to the memory sections 120-A and 120-B can provide a data word to the first data buffer block 110 via link 102, and further provide address and control signals to the address device 130 via links 104 and 106 respectively. As the address device 130 receives the address and control signals, the address device 130 can make a determination whether a particular variable is misaligned, i.e., whether a particular data variable crosses the sixty-four bit physical memory boundary.

If a particular data variable is misaligned, the address device 130 can provide an offset to the first data buffer 110 via link 138-W. For example, if a particular eight-byte data variable is misaligned such that the first byte of the misaligned data variable is located at the sixth byte of the physical memory, the address device 130 can provide an offset of five to the first data buffer block 110.

As the address device 130 provides the offset to the first data buffer block 110, the address device 130 can further provide address and control information to the memory sections 120-A and 120-B. The appropriate addressing information is provided to the memory sections 120-A and 120-B via links 132-A and 132-B, respectively. The write control information is provided to the memory sections 120-A and 120-B via links 134-A and 134-B, respectively. For the example immediately above, the address device 130 can provide a first address to memory section 120-A and a second address to memory location 120-B, where the second address is incrementally larger than the first address. Simultaneously, the address device 130 can provide write control information that can cause a write operation for the upper three bytes of the first memory section 120-A and the lower five bytes of the second memory section 120-B.

As the address device 130 provides address, control and offset information, the first data buffer block 110 can receive the data variable along with the offset information, manipulate and divide the data into a first portion and second portion and appropriately feed the first portion to one memory section 120-A or 120-B and the second portion to the other memory section 120-B or 120-A. A link 112-A conveys data from the first data buffer 110 to the first memory section 120-A and another link 112-B conveys data from the first buffer 110 to the second memory section 120-B. Again, for the example above, assuming the received data variable is eight bytes wide and has an offset of five, the first data buffer block 110 can direct the low three bytes of the data variable to the high three bytes of memory section 120-A, and further provide the high five bytes of the data variable to the low five bytes of memory section 120-B.

As the data variable is provided to the memory sections 120-A and 120-B, the memory sections 120-A and 120-B can receive their respective data portions along with the address and control information and appropriately store the data. That is, memory section 120-A can store the low three bytes of the data variable in the high three bytes of a memory location having a first address, while memory section 120-B can store the high five bytes of the data variable in the low five bytes of a memory location having a second address, where the second address will be one location higher than the first address. Accordingly, as data is provided to the various memory sections 120-A and 120-B, the address and control information can simultaneously accommodate a misaligned write operation to both memory locations in a single cycle.

In a second operation, the system 100 can read a misaligned data variable from the memory sections 120-A and 120-B. During operation, as an external device provides the appropriate address and control signals via links 104 and 106 respectively, the address device 130 can receive the address and control signals, provide an offset to the second data buffer block 140 via link 138-R, provide the appropriate addressing information to memory sections 120-A and 120-B via links 132-A and 132-B respectively and further provide the appropriate read control information to memory sections 120-A and 120-B via links 136-A and 136-B respectively.

The memory sections 120-A and 120-B can receive the address and read control information and provide the appropriate bytes of data to the second data buffer 140 via links 122-A and 122-B. The second data buffer block 140 in turn can receive the data bytes from the memory sections 120-A and 120-B and combine the received data bytes into a single data variable taking into account the offset provided by the address device 130. For example, assuming that an eight-byte data variable is read with the low two bytes provided by the high two bytes of memory section 120-A and the remaining six bytes provided by the low six bytes of memory section 120-B (which assumes a data offset of six), the second data buffer block 140 can receive the various bytes, combine the various bytes into a single contiguous data variable having eight bytes, appropriately shift the combined data variable by six bytes and provide the combined/shifted data variable to an external device.

The exemplary first data buffer block 110 can be a portion of integrated circuit containing various logic circuits that can receive a data variable of a given size, effectively perform a circular-barrel shift/multiplexing operation on the received data variable and provide portions of the shifted/multiplexed data variable to the memory sections 120-A and 120-B. However, it should be appreciated that, in various embodiments, the first data buffer block can use any combination of elements, such as shifters, barrel shifters, multiplexers, various sum-of-products-based logic, or any other known or later developed combination of systems and devices that can receive a data variable, perform the equivalent of a shifting operation on the received data variable and provide the shifted data to the memory sections 120-A and 120-B without departing from the spirit and scope of the present invention.

The second data buffer block 140, like the first data buffer 110, can be a portion of an integrated circuit containing various logic circuits. However, like the first data buffer block 110, it should be appreciated that the second data buffer block 140 can be any device capable of receiving various portions of data from multiple memories, combine the received data portions, and provide the combined data to an external device without departing from the spirit and scope of the present invention.

The address device 130, like the first and second data buffer blocks 110 and 140, can be a collection of logic circuits on a portion of an integrated circuit. However, it should be appreciated that the address device 130 can be any combination of systems and devices capable of receiving address and control signals from an external device and providing address and control information to memory sections 120-A and 120-B as well as offset information to the data buffers 110 and 130 without departing from the spirit and scope of the present invention.

Figure 2:
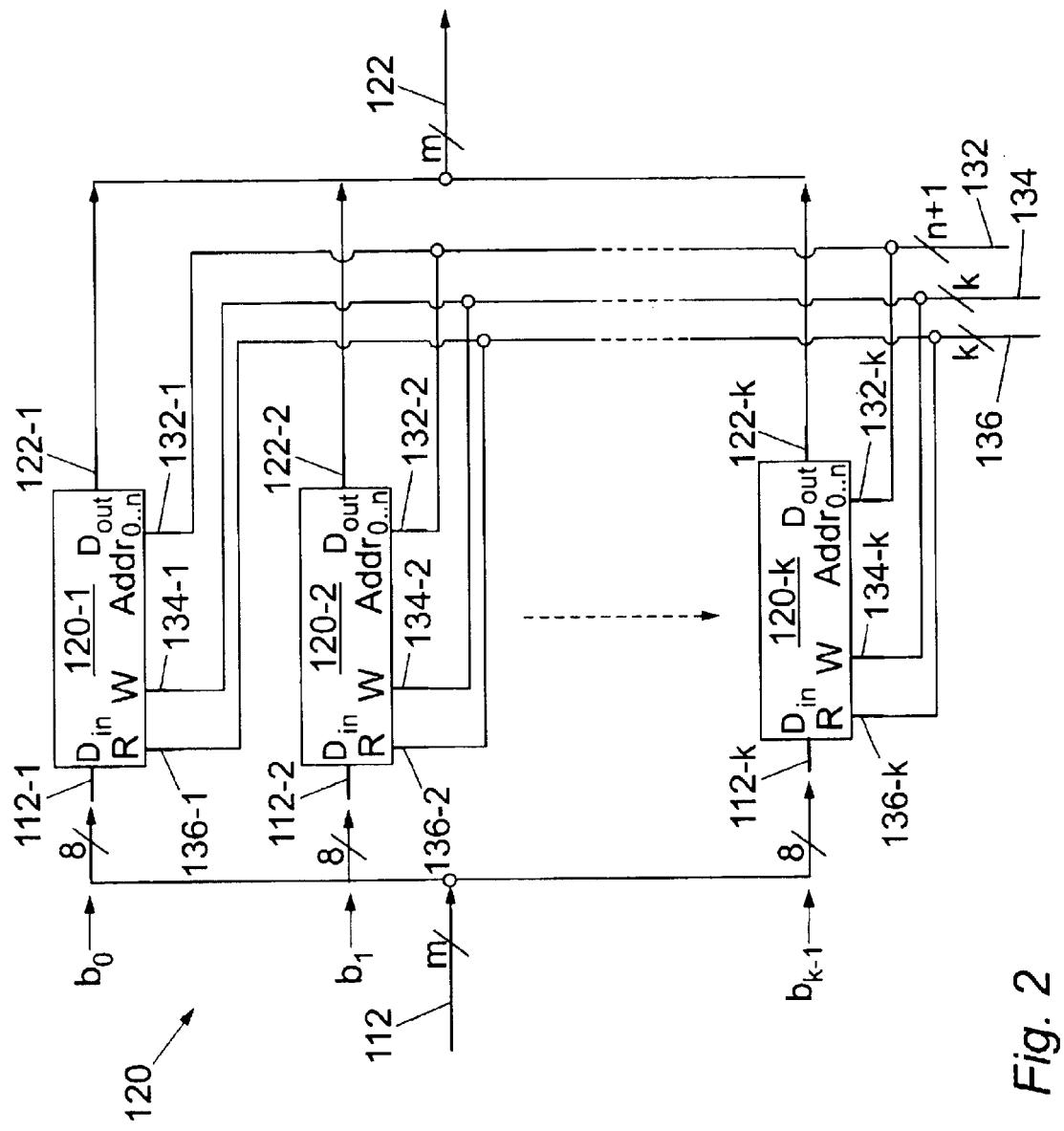
FIG. 2 is a block diagram of the memories of FIG. 1.

FIG. 2 depicts a memory system, such as the memory sections 120-A and 120B of FIG. 1. As shown in FIG. 2, the memory system 120 includes a number of byte-wide memory modules 120-1, 120-2 ... 120-k. The various memory modules 120-1, 120-2, ... 120-k each have a data input port 112-1, 112-2, ... 112-k, a data output port 122-1, 122-2, ... 122-k, an address port 132-1, 132-2, ... 132-k, a write port 134-1, 134-2, ... 134-k and a read port 136-1, 136-2, ... 136-k.

In a first operation, a data can be selectively written to any combination of the memory modules 120-1, 120-2, ... 120-k by providing the appropriate data to each of the data input ports 112-1, 112-2, ... 112-k via bus 112 while applying the appropriate address information to the address ports 132-1, 132-2, ... 132-k via bus 132 and write control information, such as write strobes, to the appropriate write ports 134-1, 134-2, ... 134-k via bus 134.

Similarly, data can be read from the memory system 120, by providing the appropriate address information to the various address ports 132-1, 132-2, ... 132-k via bus 132 as well as the appropriate read control information, such as read strobes, to the various read ports 136-1, 136-2, ... 136-k via bus 136. As the address and read control information are received by the various memory modules 120-1, 120-2, ... 120-k, it should be appreciated that the appropriate memory modules 120-1, 120-2, ... 120-k will enable output buffers associated with their output ports 122-1, 122-2, ... 122-k such that data stored within each module 120-1, 120-2, ... 120-k can be provided to data-bus 122. It should also be appreciated that because read operations do not generally alter the contents of a memory module, the array of individual read strobes can be replace by a single read strobe with the understanding that using a single read strobe may cause the memory system 120 to use more power.

While the exemplary memory modules 120-1, 120-2, ... 120-k are controlled using read and write strobes, it should be appreciated that in various embodiments, the various memory modules 120-1, 120-2, ... 120-k can be controlled using a variety of signals including read strobes, write strobes, chip selects, output enable signals, or any other signal useful for selectively writing data to, or reading data from, a memory device without departing from the spirit and scope of the present invention.

The exemplary memory modules 120-1, 120-2, ... 120-k are high-speed random access memory (RAM) integrated circuits with each device being eight bits wide and having 242,144 separate locations. However, it should be appreciated that the various memory modules 120-1, 120-2, ... 120-k can be any other known memory device capable of being selectively read or written to, such as RAMs, read only memories (ROMs), EPROMs, EEPROMs, and the like. It should further be appreciated that the particular width and depth of each memory module, 120-1, 120-2, ... 120-k can vary as desired or otherwise required by design, without departing from the spirit and scope of the present invention.

Figure 3A:
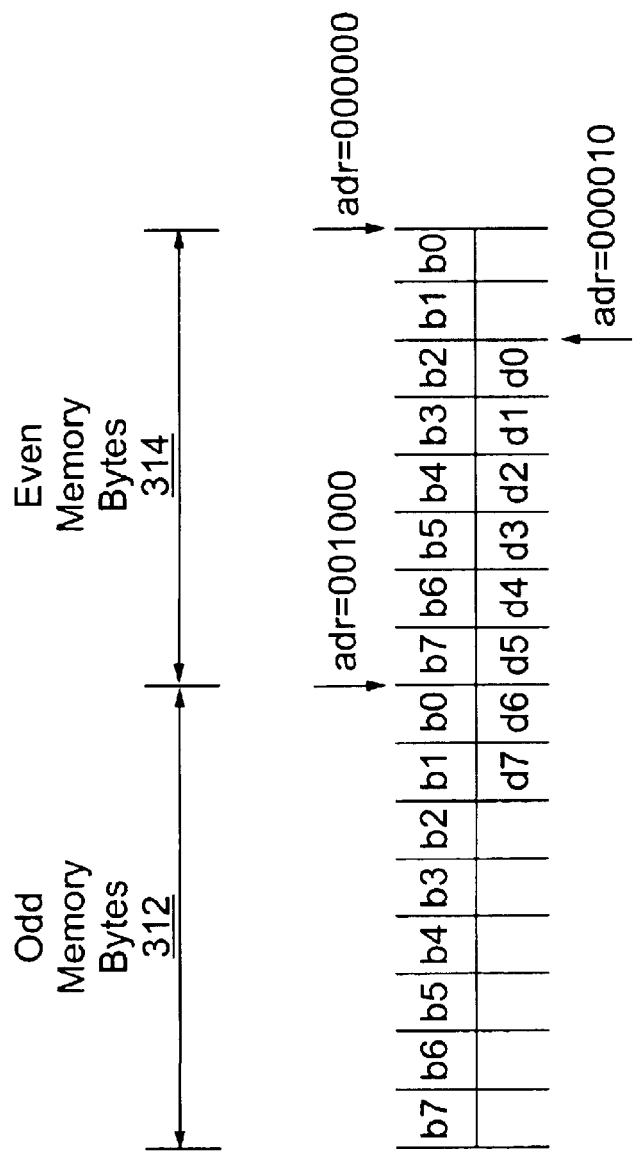
FIGS. 3A and 3B depicts a first memory access operation according to the present invention.
Figure 3B:
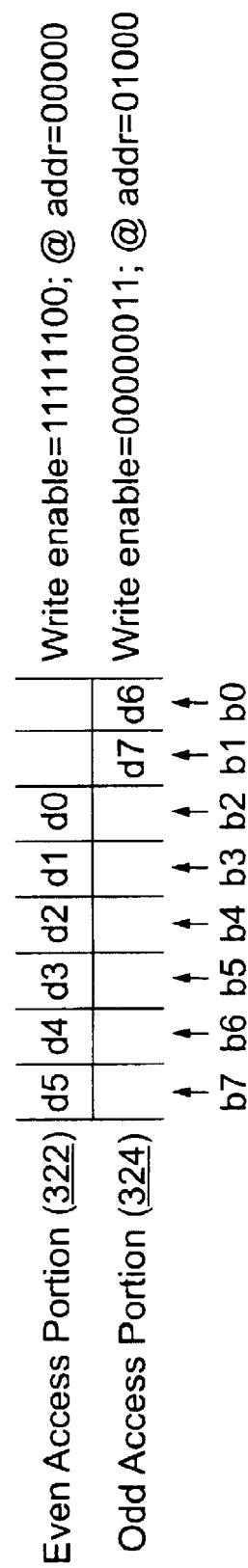

FIGS. 3A and 3B depict the operations of a misaligned data word being written to a system, such as a memory system depicted in FIGS. 1 and 2. As shown in FIG. 3A, a data variable {d7 ... d0} can be misaligned with respect to a physical memory consisting of eight bytes {b7 ... b0}. Although the logical width of a physical memory may appear as eight bytes {b7 ... b0}, as discussed above the actual physical data width can be sixteen bytes {b7 ... b0, b7 ... b0} of data including a number of odd memory bytes 312 and even memory bytes 314.

Because the exemplary data variable is offset by two bytes, the low six bytes of the data variable {d5 ... d0} can be written to the high bytes {b7 ... b2} respectively of the even memory bytes 314. Similarly, high two data variable bytes {d7, d6} can be written to the two low memory bytes {b1, b0} respectively of the odd memory bytes 312.

FIG. 3B depicts the data variable {d7 ... d0} shown in FIG. 3A broken into an even portion 322 consisting of data variable bytes {d5 ... d0} and an odd portion 334 consisting of data variable bytes {d7, d6}. As shown in FIG. 3B, because only the high six bytes of the even portion 322 are to be written to, write enable signals="11111100" representing an array of write strobes can be provided to an array of individual byte-wide memory modules of an even memory (at a relative address of "00000") to activate write operations at the appropriate memory modules. Similarly, because only the low two bytes of the odd portion 324 are to be written, a write enable signals of "00000011" can be similarly applied to another array of memory modules at a relative address of "01000" to activate write operations at the appropriate odd memory modules.

FIGS. 4A–4C depict a second memory access operation where a four-byte data variable {d3 ... d0} can be read from a memory system capable of reading a misaligned data variable in a single cycle. As shown in FIG. 4A, the data variable {d3 ... d0} has an offset of five bytes such that data variable bytes {d2, d1, d0} can be read from the high three memory bytes {b7, b6, b5} of even memory bytes 414 and data variable byte {d3} can be read from the low memory byte {b0} of odd memory bytes 412.

FIG. 4B depicts the data variable {d3 ... d0} of FIG. 4A broken into an even portion 422 and an odd portion 424 with data variable bytes {d2, d1, d0} included in the even portion 422 and data variable byte {d3} included in the odd portion 424. Since only the upper three bytes {b7, b6, b5} of the even portion 422 are to be read, read enable signals of "11100000" can be applied to respective byte-wide memory modules of an even portion memory. Similarly, because only data byte {b0} is to be read from the odd portion 424, read enable signals of "00000001" can be applied to an array of memory modules that comprise an odd memory. FIG. 4C demonstrates that the bytes of the data variable {d3 ... d0} can be combined and shifted such that the various bytes {d3 ... d0} of the data variable are respectively aligned with memory bytes {b3 ... b0}.

Figure 5:
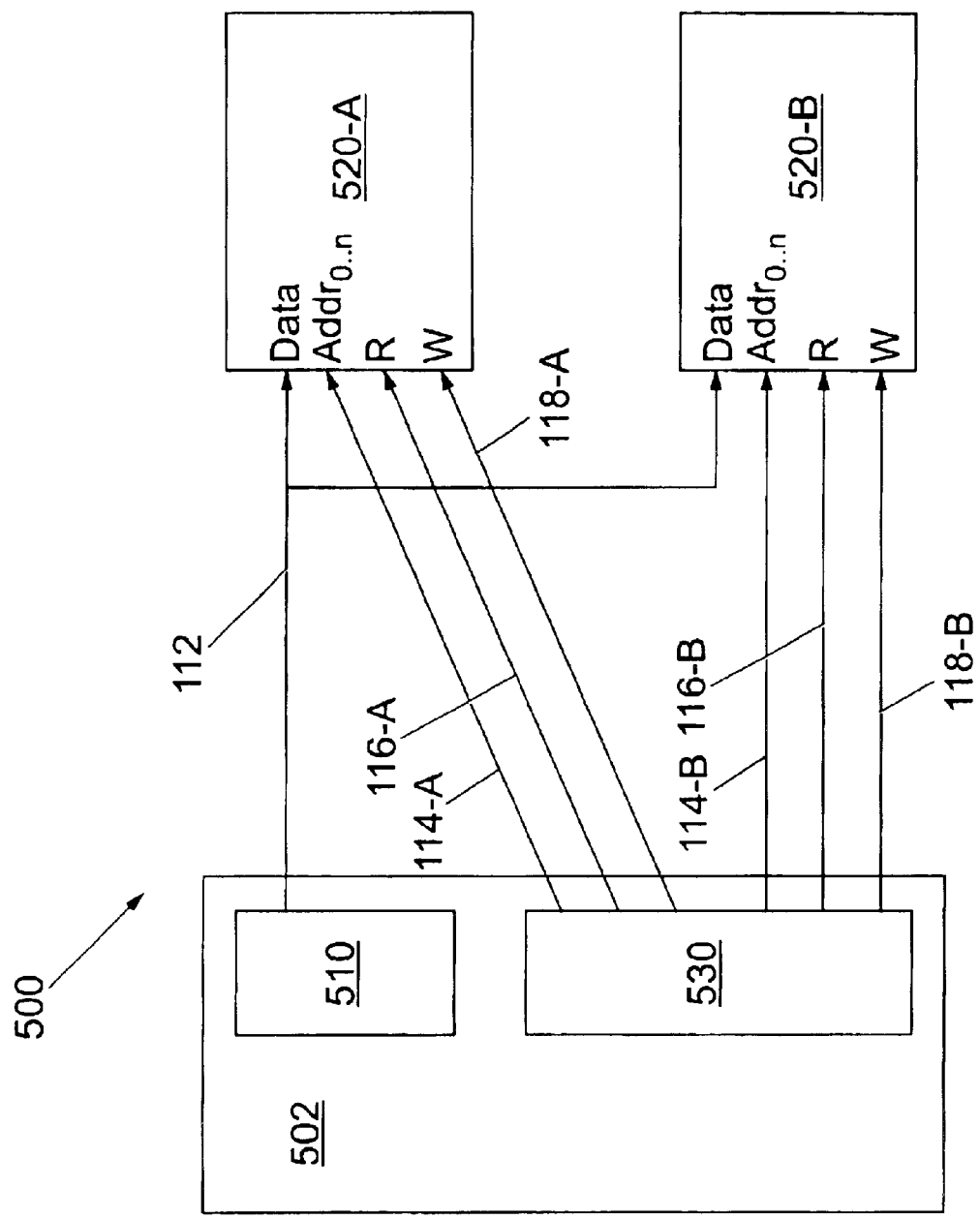
FIG. 5 is a block diagram of a second exemplary system capable of accessing misaligned data in a single cycle according to the present invention.

FIG. 5 is a second exemplary embodiment of a system 500 capable of reading and writing misaligned data variables in a single memory-access cycle. As shown in FIG. 5, the system 500 includes a controller 502, an even memory section 520-A and an odd memory section 520-B. The controller 502 includes a data buffer block 510 and an address device 530. As with the memory system 100 of FIG. 1, the second memory system 500 can read and write misaligned data bytes. However, unlike the memory system 100 of FIG. 1, the second memory system 500 can read and write data using a bi-directional bussed system.

In a write operation, the data buffer block 510 can generate or otherwise derive data from controller 502, optionally shift the data, and provide the data to the even and odd memory sections 520-A and 520-B. Simultaneously, the address device 530 can provide even address information and even write control information to the even memory section 520-A via links 114-A and 118-A respectively, and further provide odd address information and odd write control information to the odd memory section 520-B via links 114-B and 118-B respectively.

As discussed above, if a particular data variable is misaligned, the address device 530 can provide different address information to the different memory sections 520-A and 520-B, as well as a different write control information, such as an array of write strobes. Accordingly, by using the above-described technique, a data variable can be written to the memory sections 520-A and 520-B in a single memory-access cycle regardless of how the data variable is aligned.

In a second operation, the controller 502 can read a data variable from the memory sections 520-A and 520-B in a single cycle regardless of the alignment of the data variable. During operation, the address device 530 can provide the appropriate addresses information as well as the appropriate read control information, such as an array of read strobes, to each of the even and odd memory sections 520-A and 520-B. As the memory sections 520-A and 520-B provide the requisite data bytes to the data buffer 510, the data buffer block 510 can receive the appropriate data bytes, then combine and shift the data bytes as is required by a particular operation of the controller 502.

While the address device 530 is depicted as generating two different addresses using two disjoint address busses 114-A and 114-B, it should be appreciated that in various embodiments, the address device 530 can provide address information using address busses that are partially disjoint. For example, assuming the address device 530 is a sixteen-bit address device, the address device 530 can provide the most significant eight address bits to both the even and odd memory sections 520-A and 520-B using eight shared address lines {A15 . . . A8}, while providing two separate sets of least significant address bits {A7 . . . A0}$_{even}$ and {A7 . . . A0}$_{odd}$ to memory sections 520-A and 520-B respectively.

While providing partially disjoint address busses does not allow the system 500 to access every possible misaligned memory location in a single memory-access cycle, the total number of address lines is otherwise reduced. For the example above, assuming the address bus is sixteen bits wide with the upper most eight bits being shared, a single memory-access cycle access can be performed for 255 out of every 256 memory locations. However, the controller 502 requires eight fewer address ports/pins and supporting electronic circuits.

The exemplary controller 502 can be a microcontroller-type device on an integrated circuit. However, it should be appreciated that the controller 502 can be any of various sequential instruction machines, such as a controller, a microcontroller, microprocessor, a processor, a digital signal processor or any other known or later developed device that can act as a sequential instruction machine and access various memories.

Figure 6:
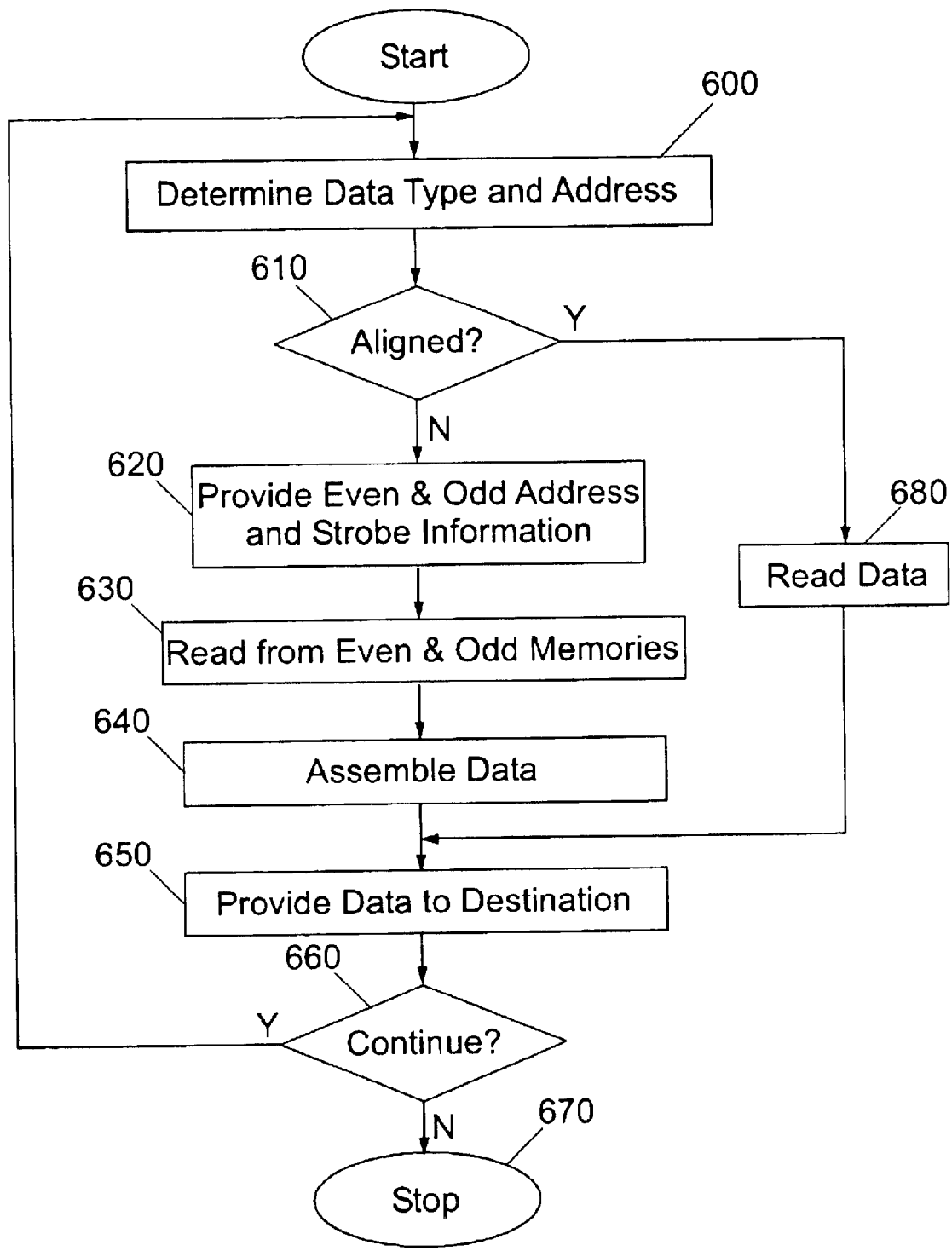
FIG. 6 is a flowchart outlining a first exemplary operation according to the present invention.

FIG. 6 is a block diagram of a flowchart of a first exemplary operation according to the present invention. The process starts at step 600 where a data variable type is determined, i.e., the size of the data variable, as well as the address that the data variable is to be read from. Next, in step 610, a determination is made as to whether the data variable is aligned. That is, it is determined whether the data of the data variable exists in two separate logical memory locations. If the data variable is aligned, control jumps to steps 680; otherwise, control continues to step 620. In step 680, data is read from a memory and control continues to step 650.

In step 620, even and odd address information, as well as even and odd read control information, is provided to each of two memory sections, such as the even and odd memory sections shown in FIGS. 1 and 5. Next, in step 630, even and odd portions of the data variable are read from the even and odd memory sections. Then, in step 640, the even and odd portions are assembled into a single data variable. As discussed above, assembling a data variable can include logically combining the even and odd portions as well as shifting the combined portions such that the shifted data portions can be provided to an external device as a single data variable aligned with the least significant bytes of a logical bus. Control continues to step 650.

In step 650, the assembled data of 640 is provided to another device, such as an integrated sequential instruction machine. Next, in step 660, a determination is made as to whether to continue reading data variables. If further data variables are to be read, control jumps back to step 600; otherwise, control continues to step 670 where the process stops.

Figure 7:
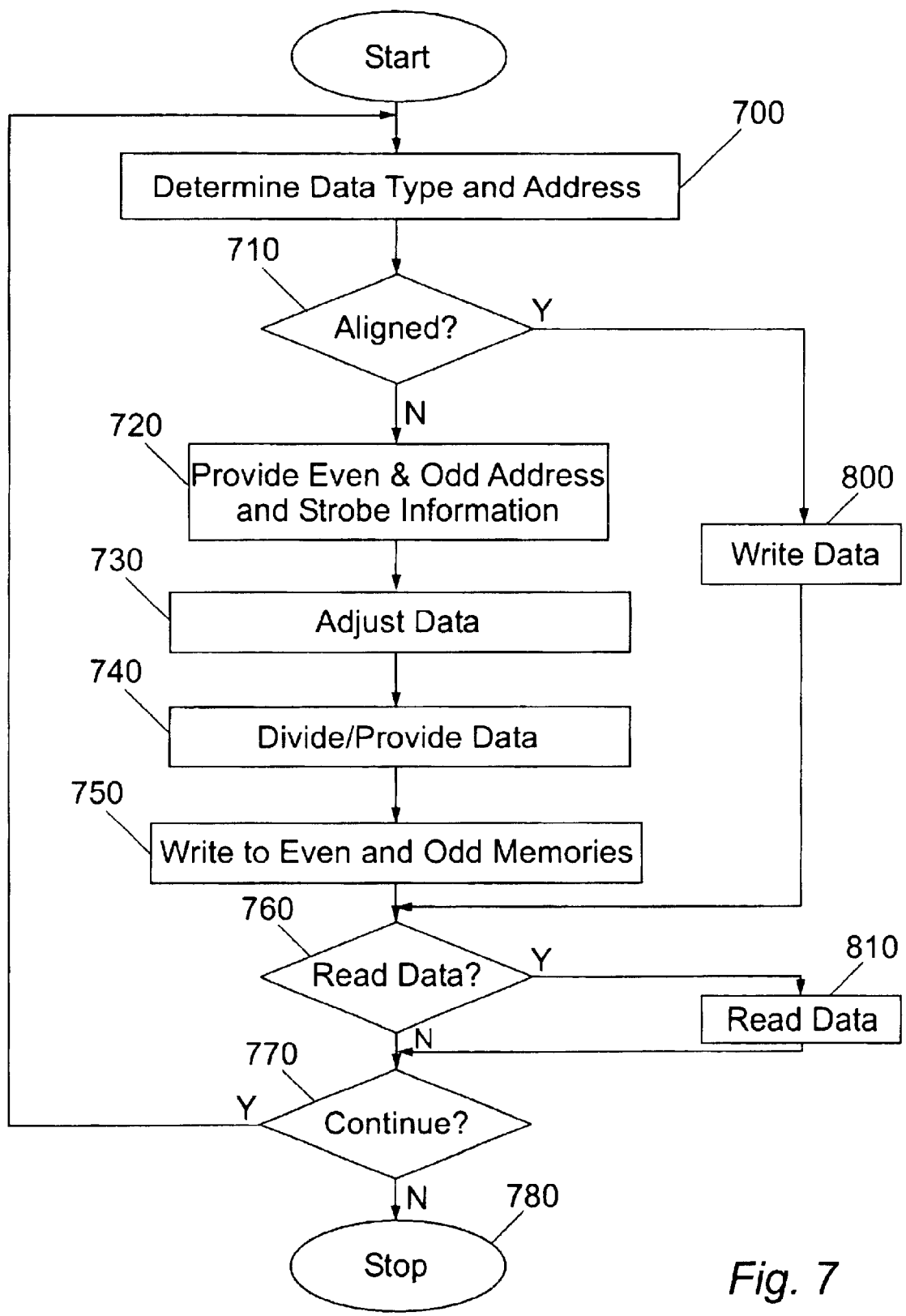
FIG. 7 is a flowchart outlining a second exemplary operation according to the present invention.

FIG. 7 is a flowchart outlining a second exemplary operation according to the present invention. As shown in FIG. 7, the process starts at step 700 where the type and address of a particular data variable is determined. Next, at step 710, a determination is made as to whether the data variable is aligned. If the data variable is aligned, control jumps to step 800; otherwise, control continues to step 720. In step 800, data is written to a memory and control continues to step 760.

In step 720, even and odd address information, as well as even and odd write control information, is provided to even and odd memory sections. Next, in step 730, the data in the data variable is appropriately adjusted/manipulated by any of several operations that effectively perform a shifting operation such that the data can be provided to the appropriate memory modules of both an even and odd memory section. Then, in step 740, the data of the data variable is divided into an even portion and an odd portion with the even portion provided to an even memory section and the odd portion provided to an odd memory section. Control continues to step 750.

In step 750, the even and odd portions are effectively written to the even and odd memory sections. Next, in step 760, a determination is made as to whether the data written in steps 700–750 is to be read. If data is to be read, control jumps to step 810; otherwise, control continues to step 770.

In step 810, the appropriate data is read. In various embodiments, the data read can be performed according to any number of techniques, such as the technique outlined in the flowchart of FIG. 6 or described according to FIGS. 1–5. Control continues to step 770.

In step 770, a determination is made as to whether to continue to write and optionally read various data variables. If the operation is to continue, control jumps back to step 700; otherwise, control continues to step 780 where the process stops.

As shown in FIGS. 1–5, the systems and methods of this invention are preferably implemented using dedicated logic or other integrated circuits. However, the systems and methods can also be implemented using any combination of one or more general purpose computers, special purpose computers, program microprocessors or microcontroller and peripheral integrating circuit elements, hardware electronic or logic circuits such as application specific integrated circuits (ASICs), discrete element circuits, programmable logic devices such as PLAs, FPGAs, PALs or the like. In general, any device on which exists a finite state machine capable of implementing the various elements of FIGS. 1–5 and the flowcharts of FIGS. 6 and 7 can be used to implement the sequence of functions.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A memory system that can access a misaligned data word, comprising:
    a first memory section coupled to a first address bus;
    a second memory section coupled to a second address bus,
    an address device that simultaneously provides a first address to the first memory section using the first address bus and a second address to the second memory section using the second address bus, wherein the second address is not equal to the first address; and
    buffer circuitry that performs an access operation for the misaligned data word,
    wherein the access operation is at least one of a simultaneous read operation to the first and second memory sections or a simultaneous write operation to the first and second memory sections,
    wherein the buffer circuitry reads a first portion of the misaligned data word from the first memory section and reads a second portion of the misaligned data word from the second memory section.

2. The system of claim 1, wherein the buffer circuitry receives the first and second word portions and assembles the word from the first and second word portions.

3. A memory system that can access a misaligned data word, comprising:
    a first memory section coupled to a first address bus;
    a second memory section coupled to a second address bus,
    an address device that simultaneously provides a first address to the first memory section using the first address bus and a second address to the second memory section using the second address bus, wherein the second address is not equal to the first address; and
    buffer circuitry that performs an access operation for the misaligned data word,
    wherein the access operation is at least one of a simultaneous read operation to the first and second memory sections or a simultaneous write operation to the first and second memory sections,
    wherein the buffer circuitry writes a first portion of the misaligned data word to the first memory section and writes a second portion of the misaligned data word to the second memory section.

4. The system of claim 3, wherein the buffer circuitry effectively performs a shift operation on the word before the buffer circuitry performs the write operations.

5. A memory system that can access a misaligned data word, comprising:
    a first memory section coupled to a first address bus;
    a second memory section coupled to a second address bus,
    an address device that simultaneously provides a first address to the first memory section using the first address bus and a second address to the second memory section using the second address bus, wherein the second address is not equal to the first address; and
    buffer circuitry that performs an access operation for the misaligned data word,
    wherein the access operation is at least one of a simultaneous read operation to the first and second memory sections or a simultaneous write operation to the first and second memory sections,
    wherein the access operation is performed in a single cycle and
    wherein the first memory section contains a same number of bits as the second memory section.

6. A memory system that can access a misaligned data word, comprising:
    a first memory section coupled to a first address bus:
    a second memory section coupled to a second address bus,
    an address device that simultaneously provides a first address to the first memory section using the first address bus and a second address to the second memory section using the second address bus, wherein the second address is not equal to the first address; and
    buffer circuitry that performs an access operation for the misaligned data word,
    wherein the access operation is at least one of a simultaneous read operation to the first and second memory sections or a simultaneous write operation to the first and second memory sections,
    wherein the access operation is performed in a single cycle and
    wherein the second address is one location higher than the first memory location.

7. The system of claim 6, wherein the first and second address busses have at least one disjoint address line.

8. The system of claim 6, wherein the first and second address busses have at least a plurality of disjoint address lines.

9. The system of claim 8, wherein the address lines of the first and second address busses are completely disjoint.

10. A memory system that can access a misaligned data word, comprising:
    a first memory section coupled to a first address bus;
    a second memory section coupled to a second address bus,
    an address device that simultaneously provides a first address to the first memory section using the first address bus and a second address to the second memory section using the second address bus, wherein the second address is not equal to the first address; and
    buffer circuitry that performs an access operation for the misaligned data word,
    wherein the access operation is at least one of a simultaneous read operation to the first and second memory sections or a simultaneous write operation to the first and second memory sections,
    wherein the access operation is performed in a single cycle and
    wherein the address device further provides a plurality of read control information signals to a plurality of first modules of the first memory section, wherein the read control information signal activates read operations on only those first modules containing word data.

11. The system of claim 10, wherein the address device further provides a plurality of write control information signals to the plurality of first modules of the first memory section, wherein the write control information signals activate write operations on only those first modules designated for data word information.

12. The system of claim 3, wherein the address device further provides write control information signals to a plurality of first modules of the first memory section, wherein the write control information signals activate write operations on only those first modules designated for data word information.

13. A memory system that can access a misaligned data word held in first and second separately addressable memory sections, comprising:

a first memory section for holding a first portion of the misaligned data word at a first location;

a second memory section for holding a second portion of the misaligned data word at a second location;

an addressing means that simultaneously provides a first address to the first memory section and a second address to the second memory section, the first and second memory addresses respectively indicating the locations of first and second portions of the misaligned data word in the first and second memory sections; and a buffering means that performs an access operation in a single memory-access cycle, wherein the access operation is at least one of a simultaneous read operation from the first and second memory sections or a simultaneous write operation to the first and second memory sections, wherein the first memory section is an array comprising even address locations and the second memory section is a different memory array comprising odd address locations.

* * * * *